United States Patent
Tsai et al.

(10) Patent No.: US 7,538,489 B2
(45) Date of Patent: May 26, 2009

(54) FULL-COLOR ACTIVE MATRIX ORGANIC ELECTROLUMINESCENT DEVICE, FABRICATION METHOD THEREOF AND ELECTRONIC DEVICES EMPLOYING THE SAME

(75) Inventors: Yaw-Ming Tsai, Taichung Hsien (TW); Wei-Chieh Hsueh, Tainan (TW)

(73) Assignee: TPO Displays Corp., Chu-Nan (TW)

( * ) Notice: Subject to any disclaimer, the term of this patent is extended or adjusted under 35 U.S.C. 154(b) by 519 days.

(21) Appl. No.: 11/271,555

(22) Filed: Nov. 10, 2005

(65) Prior Publication Data
US 2006/0097275 A1    May 11, 2006

(30) Foreign Application Priority Data
Nov. 10, 2004    (TW) .............................. 93134258 A

(51) Int. Cl.
*H01J 1/62*    (2006.01)
(52) U.S. Cl. ........................................ 313/506; 313/504
(58) Field of Classification Search ................. 313/498, 313/504, 506, 509, 512
See application file for complete search history.

(56) References Cited

U.S. PATENT DOCUMENTS

| | | | |
|---|---|---|---|
| 6,280,861 B1 * | 8/2001 | Hosokawa et al. ........... 428/690 |
| 6,512,504 B1 * | 1/2003 | Yamauchi et al. ............. 345/87 |
| 6,888,588 B2 | 5/2005 | Luo | |
| 6,936,846 B2 * | 8/2005 | Koyama et al. ................ 257/71 |
| 7,229,703 B2 * | 6/2007 | Kawashima et al. ........ 428/690 |
| 2005/0225251 A1 | 10/2005 | Hsueh | |
| 2006/0012742 A1 | 1/2006 | Tsai et al. | |
| 2006/0082295 A1 * | 4/2006 | Chin et al. ................... 313/506 |

FOREIGN PATENT DOCUMENTS

CN    1400673    3/2003

\* cited by examiner

Primary Examiner—Vip Patel
(74) Attorney, Agent, or Firm—Liu & Liu

(57) ABSTRACT

A full-color active matrix organic electroluminescent device and fabrication method thereof. The full-color active matrix organic electroluminescent device includes a substrate with a plurality of TFTs, a buffer layer formed on the substrate beyond the TFTs, a color filter formed on the buffer layer, a flat layer formed on the entire surface of the color filter, a first electrode formed on the flat layer, an organic electroluminescent layer formed on the first electrode, and a second electrode formed on the organic electroluminescent layer, wherein the flat layer is formed by a low temperature thin film process.

14 Claims, 6 Drawing Sheets

FULL-COLOR ACTIVE MATRIX ORGANIC ELECTROLUMINESCENT DEVICE, FABRICATION METHOD THEREOF AND ELECTRONIC DEVICES EMPLOYING THE SAME

BACKGROUND

The invention relates to an active matrix organic electroluminescent device and, more particularly, to a full-color active matrix organic electroluminescent device with color filters.

Several methods have been employed to achieve full color emission in organic electroluminescent devices. In general, full color organic electroluminescent devices are fabricated by a method of RGB emitting layers or color changing method. Among them, the so-called "color changing method" involves forming white organic light-emitting diodes respectively on corresponding red, green and blue color filters, and then driven by bias voltages to emit red, green and blue respectively.

FIG. 1 is a cross section illustrating a conventional full-color active matrix organic electroluminescent device having a color filter on array (COA) structure. The full-color active matrix organic electroluminescent device 10 includes a substrate 12, a plurality of TFTs 20, RGB color filters 32, 34, and 36, and a plurality of white organic light-emitting diodes 40, wherein each white organic light-emitting diode 40 comprises a ITO electrode 42 formed on the color filters 32, 34, and 36 to achieve electrical connection with the TFT 20. The light emitted from the white organic light-emitting diode 40 is converted to RGB by passing through the RGB color filters 32, 34, and 36.

FIG. 2 is a close-up cross-section view of location A shown in FIG. 1. Since the color filters 32, 34, and 36 have top surfaces 37 with severe surface roughness of around 20 nm, the direct deposition of the subsequent ITO electrode 40 may result in a rough surface 43 with a surface roughness also around 20 nm. Therefore, in addition to failing to fulfill the requirements of an organic electroluminescent device with a preferred surface roughness of the electrode less than 10 nm, current-leakage and point discharge may also occur, adversely affecting luminance efficiency and product life.

Moreover, the color filter typically comprises organic compounds, such as organic dyes or resins, and has a thermal decomposition temperature of about 350° C. If the following ITO electrode is directly formed on the color filters by a thin film process with a high operating temperature of more than 400° C. (such as by chemical vapor deposit (CVD)), the top portion of the color filters can thermally expand or decompose due to high operating temperature, resulting in damage to the color filters.

Therefore, it is necessary to develop a simple and efficient manufacturing method for an OLED with a color-filter-on-array structure to obtain OLEDs having smoother transparent electrode surfaces.

Several difficulties exist which must be overcome by full-color active matrix organic electroluminescent devices in order to meet the demands of the flat panel display market. Therefore, it is necessary to develop a simple and efficient manufacturing method and structure for a full-color active matrix organic electroluminescent device to increase the performance and reliability thereof.

SUMMARY

The present invention is directed to planarization of the color filter layer in a display, prior to forming the electrode layer on the color filter layer. The present invention provides an intermediate layer between the color filter layer and the electrode layer, which serves to planarize the color filter layer to provide a relatively smooth surface for supporting the electrode layer.

One aspect of the invention provides a primer/buffer/intermediate/planarization layer having a smooth surface, serving as an under layer for a transparent electrode, formed on color filters without damaging the color filters, thereby solving the aforementioned problems. The full-color active matrix organic electroluminescent devices according to embodiments of the invention can meet the demands of the flat panel display market, due to the increased reliability, high luminescent efficiency and extended lifetime.

Another aspect of the invention provides a method for fabricating full-color active matrix organic electroluminescent devices, comprising a flat layer which is formed on color-filters by low temperature thin film process.

According to one embodiment of the invention, a full-color active matrix organic electroluminescent device comprises a plurality of pixel areas arranged in a matrix. Each pixel area comprises a buffer layer, a thin film transistor (TFT), an organic light-emitting diode (OLED), a flat layer, and a color filter, wherein the OLED comprises a first electrode electrically connected to the TFT, an organic electroluminescent layer, and a second electrode. The buffer layer and the TFT are formed on the substrate, and the color filter is formed on the buffer layer. The flat layer is formed on the color filter to serve as an under layer of the first electrode, wherein the flat layer can be formed by a low temperature thin film process and have a surface roughness of less than 10 nm. Furthermore, the first electrode, the organic electroluminescent layer, and the second electrode are sequentially formed on the flat layer.

According to another embodiment of the invention, the TFT comprises a gate insulation layer, a gate electrode, a source electrode, and a drain electrode, wherein the gate insulation layer is formed to completely cover the gate oxide and connect to the buffer layer.

According to the invention, the full-color active matrix organic electroluminescent device further comprises a patterned insulation layer formed on a part of the first electrode, exposing the first electrode formed directly above the color filter.

Another embodiment of the invention also provides a method for fabricating a full-color active matrix organic electroluminescent device. First, a substrate with a plurality of TFTs and a buffer layer formed thereon is provided, wherein the TFT comprises a gate insulation layer, a gate electrode, a source electrode, and a drain electrode. Next, a color filter is formed on the buffer layer. Next, a flat layer is formed on the color filter by a low temperature thin film process. Finally, a first electrode is formed on the flat layer and achieves electrical connection with the TFT.

In an embodiment of the invention, the method for fabricating a full-color active matrix organic electroluminescent device further comprises, after forming the first electrode on the flat layer, forming a patterned insulation layer on a part of the first electrode, exposing the first electrode formed directly above the color filter.

In another embodiment of the invention, the low temperature thin film process has an operating temperature of not more than 350° C.

A further embodiment of the invention further provides a method of fabricating a full-color active matrix organic electroluminescent device. First, a substrate with a plurality of TFTs and a buffer layer formed thereon is provided, wherein the TFT comprises a gate insulation layer, a gate electrode, a source electrode, and a drain electrode. Next, a color filter is formed on the buffer layer. Next, a flat layer is blanketly formed to completely cover the TFT, the buffer layer, and the color filter by a low temperature thin film process. Next, the flat layer is planarized to expose the top surface of the source and drain electrodes. Next, a first electrode is formed on the flat layer and connects to the exposed surface of the drain electrode. Finally, an organic electroluminescent layer and a second electrode are sequentially formed on the first electrode, wherein the first electrode, and the organic electroluminescent layer and second electrode thereupon comprise an OLED.

In yet another embodiment of the invention, the method for fabricating a full-color active matrix organic electroluminescent device omits forming a photoresist layer on the flat layer, before forming the first electrode on the flat layer.

A further aspect of the invention also provides an electronic device, including the full-color active matrix organic electroluminescent devices by the above method. The electronic device comprises the above full-color active matrix organic electroluminescent device, and a power source element, wherein the power source element electrically couples the full-color active matrix organic electroluminescent device.

A detailed description is given in the following embodiments with reference to the accompanying drawings.

BRIEF DESCRIPTION OF THE DRAWINGS

Embodiments of the invention can be more fully understood by reading the subsequent detailed description in conjunction with the examples and references made to the accompanying drawings, wherein.

DETAILED DESCRIPTION

The present invention is described herein in reference to full-color active matrix organic electroluminescent devices, in accordance with the illustrated embodiments. However, the present invention is also applicable to less than full-color electroluminescent display devices, as well as non-electroluminescent display devices such as liquid crystal display device without departing from the scope and spirit of the present invention.

The full-color active matrix organic electroluminescent device in accordance with the invention comprise single emission OLEDs and RGB color filters. The light emitted from the single emission OLEDs is converted to RGB by passing through the RGB color filters. Moreover, a flat layer serving as an under layer for the OLEDs is formed on the color filters without damaging the color filters, thereby solving the problems occurring in conventional methods. The following embodiments are intended to illustrate the invention more fully without limiting the scope of the claims, since numerous modifications and variations will be apparent to those skilled in this art.

Figure 1:
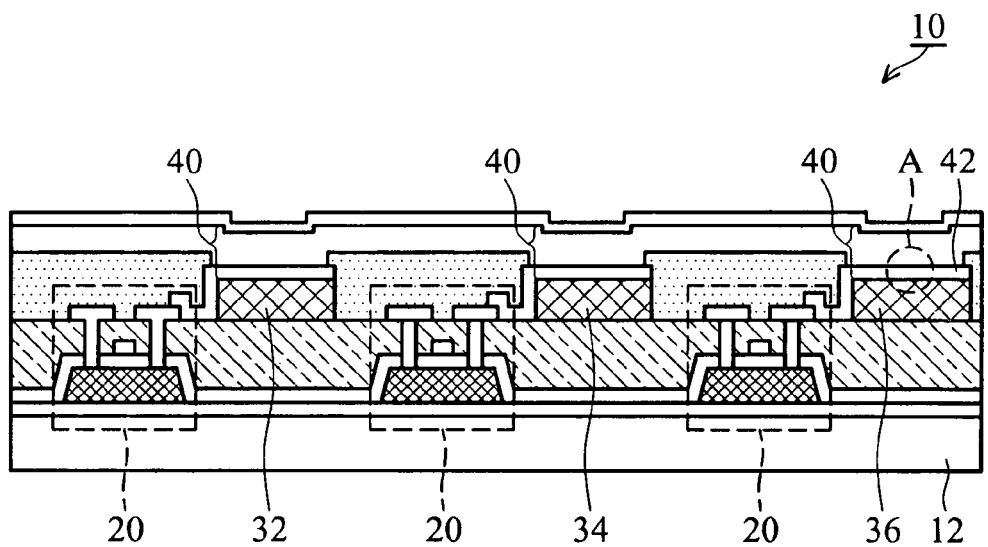
FIG. 1 is a cross section illustrating a conventional full-color active matrix organic electroluminescent device.
Figure 2:
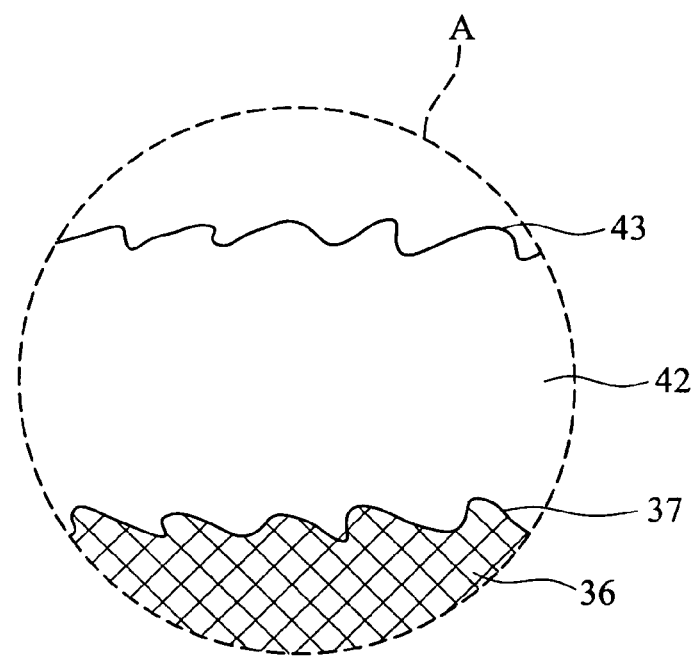
FIG. 2 is a close-up cross-section view of location A shown in FIG. 1.
Figure 3:
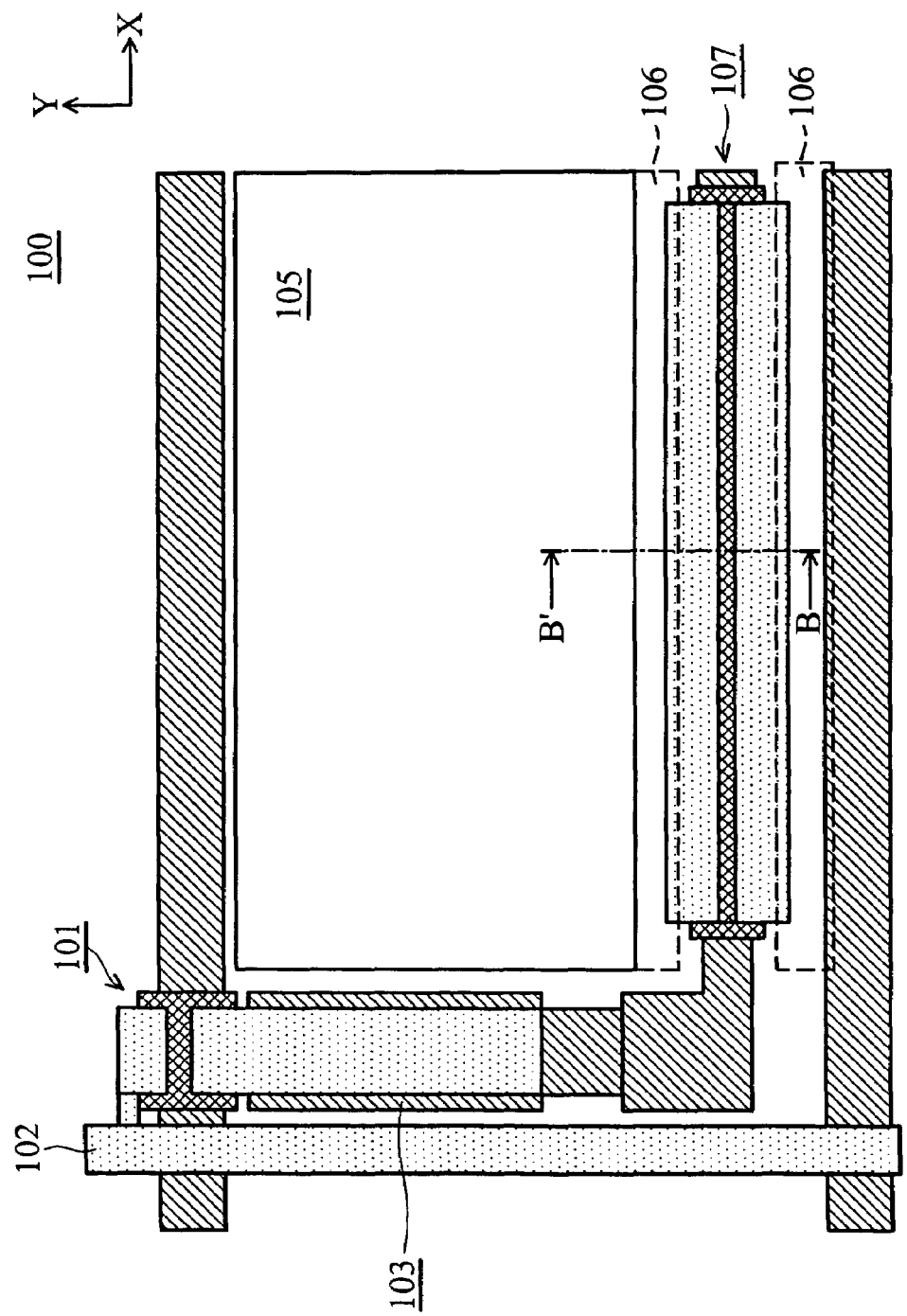
FIG. 3 is a schematic top view of a full-color active matrix organic electroluminescent device according to an embodiment of the invention.

FIG. 3 is a schematic top view of a full-color active matrix organic electroluminescent device according to the embodiment of the invention. The active matrix organic electroluminescent device comprises a plurality of pixel areas 100 arranged in a matrix form. Each pixel area 100 comprises a TFT 101 electrically connected to a data line 102 extending along a Y direction, a capacitor 103, an OLED 105, and another TFT 107 electrically connecting to the OLED 105. FIGS. 4a to 4e are sectional diagrams of FIG. 3 illustrating the manufacturing process of the full-color active matrix organic electroluminescent device according to an embodiment of the invention.

Figure 4A:
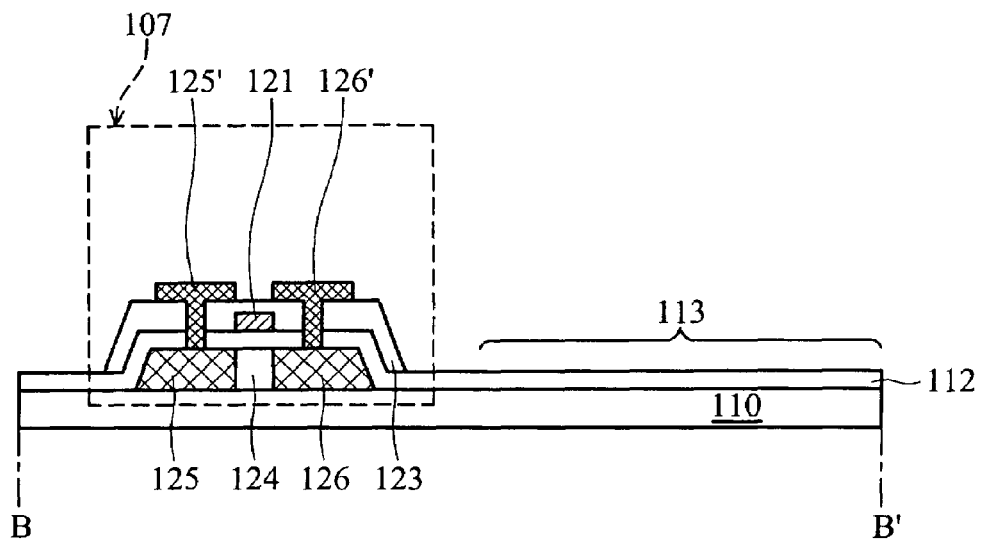
FIGS. 4a to 4e are sectional diagrams of FIG. 3 illustrating the manufacturing process of a full-color active matrix organic electroluminescent device according to an embodiment of the invention.

First, referring to FIG. 4a, the TFT 107 is formed on a substrate 110, and a buffer layer 112 is formed on the substrate 110 beyond the TFT 107, wherein a portion of the exposed surface of the buffer layer 112 is defined as a predetermined color filter area 113. The TFT comprises a semiconductor layer 124, a gate electrode 121, a dielectric layer 123, a source electrode 125', and a drain electrode 126'. The choices for the TFT 107 are unlimited, and can be amorphous-silicon thin film transistor, low temperature poly-silicon thin film transistor (LTPS-TFT), or organic thin film transistor (OTFT). Furthermore, the TFT 107 can also comprise a source contact area 125 and a drain contact area 126, wherein the source contact area 125 and the drain contact area 126 electrically connect to the source electrode 125' and drain electrode 126' respectively. The structure of the TFT is illustrated as an example, but not intended to be limitative of the invention, and can be bottom gate TFT or top gate TFT. Herein, the buffer layer 112 can be a silicon nitride and serve as a gate insulating layer, and the substrate 100 is a transparent insulating material such as a glass, or plastic substrate.

Figure 4B:
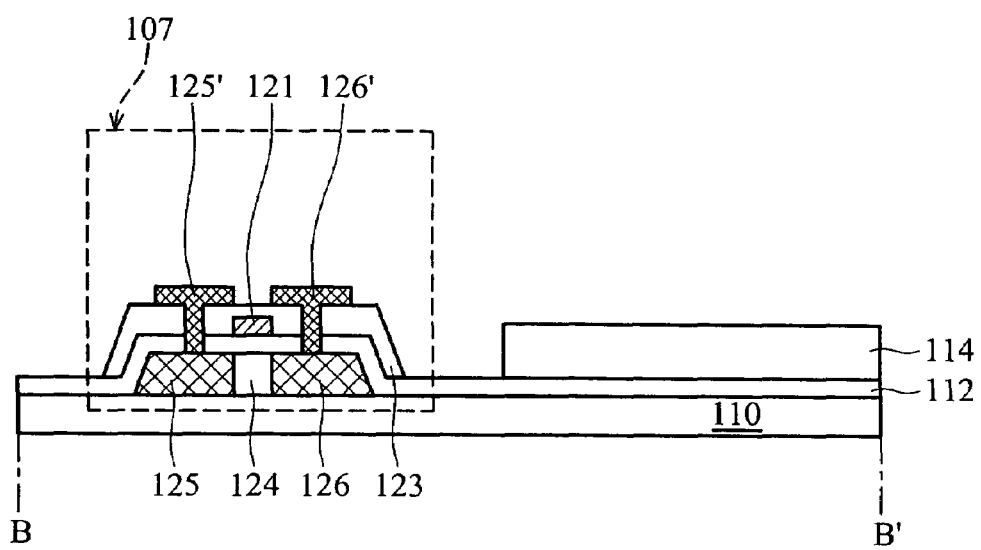

Next, referring to FIG. 4b, a color filter 114 is formed on the predetermined color filter area 113, wherein the color filter 114 can be optionally alternated between different colors across the substrate. For example, red, green, and blue color filters are employed in the pixel structures in turn across the substrate. Moreover, two different color filters can be used to produce full color images. The method of forming the color filter 114 can be the pigment dispersion method, electrodeposition method, dyeing method, or printing method. In general, since the surface roughness of the color filter is around 20 nm, the direct deposition of the following ITO electrode will result in a rough surface 43 with a surface roughness also around 20 nm.

Figure 4C:
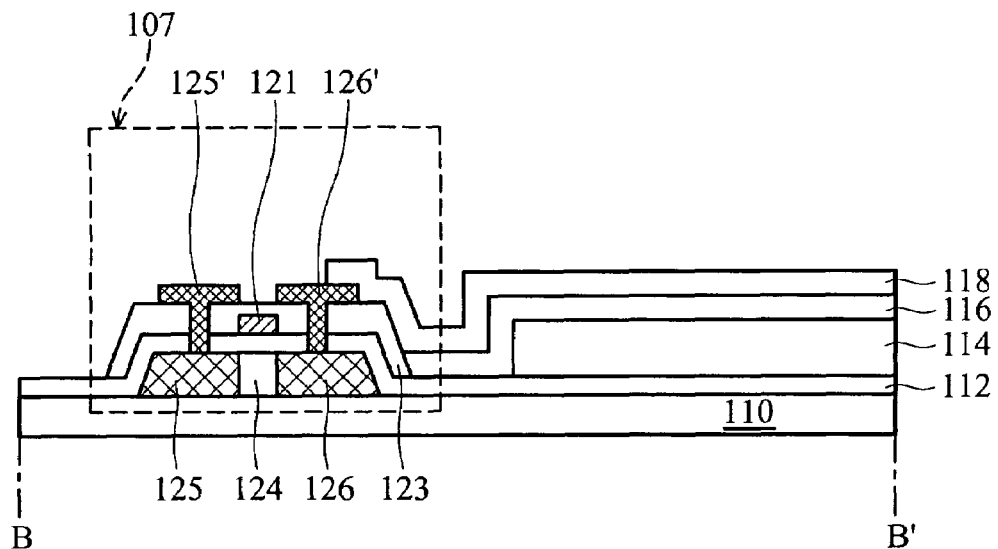

In order to solve the above-mentioned problem, referring to FIG. 4c, a flat layer 116 (i.e., a layer having a smooth top surface) is formed on the buffer layer 112 and the color filter 114 to cover the entire surface of the color filter 114 by a low temperature thin film process. The flat layer 116 has a surface roughness less than 10 nm and can be dielectric or thermal insulator materials such as low temperature dielectric material or spin-on glass (SOG). Furthermore, the thickness of the flat layer 116 is 10 times, preferably 20 times, thicker than the surface roughness of the color filter.

Additionally, the low temperature thin film process has an operating temperature T1 less than a decomposition temperature T2 of the color filter material, in order to prevent damage to the color filter. The low temperature thin film process can be liquid phase deposition, spin-on coating, or sputtering. The sputtering can be, for example, employed to form a low temperature oxide layer or low temperature nitride layer. The low temperature oxide layer can be formed using silicon target and oxygen as reactive gas at operating temperature T1 of 250° C. by low temperature magnetron sputtering.

Furthermore, after forming the flat layer on the color filter, a planarization procedure can be performed to flatten the flat layer, reducing the surface roughness of the flat layer to less than 5 nm. The planarization can be annealing or polishing.

Still referring to FIG. 4C, a transparent electrode 118, serving as the anode electrode of the OLED 105, is formed on the flat layer 116. Suitable material for the transparent electrode 118 is transparent metal or metal oxide, such as indium tin oxide (ITO), indium zinc oxide (IZO), aluminum zinc oxide (AZO), or zinc oxide (ZnO). Preferably, the transparent electrode 118 is formed by a method such as sputtering, electron beam evaporation, thermal evaporation, or chemical vapor deposition.

Figure 4D:
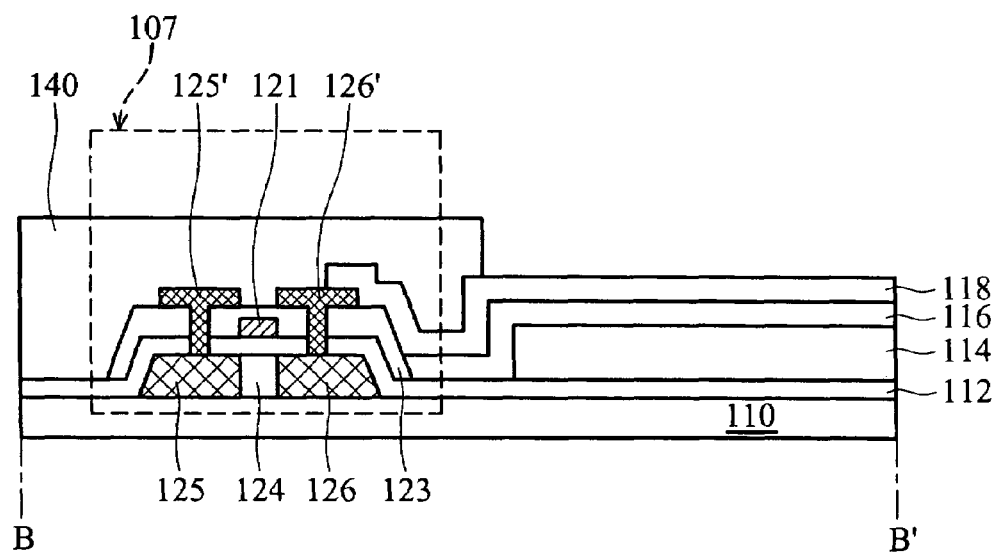

Referring to FIG. 4d, a patterned insulation layer 140 is formed on the TFT 107 to expose a part of the transparent electrode 118 formed above the color filter. The insulation layer 140 can be dielectric or organic materials. Suitable dielectric material for the insulation layer 140 are insulating oxide, nitride, carbide or combinations thereof, such as silicon nitride, silicon oxide, aluminum oxide, magnesium oxide, aluminum nitride or magnesium fluoride. Suitable organic materials for the insulation layer 140 are insulating organic material, such as acrylic resin, polyimide, or energy-curable resist.

Figure 4E:
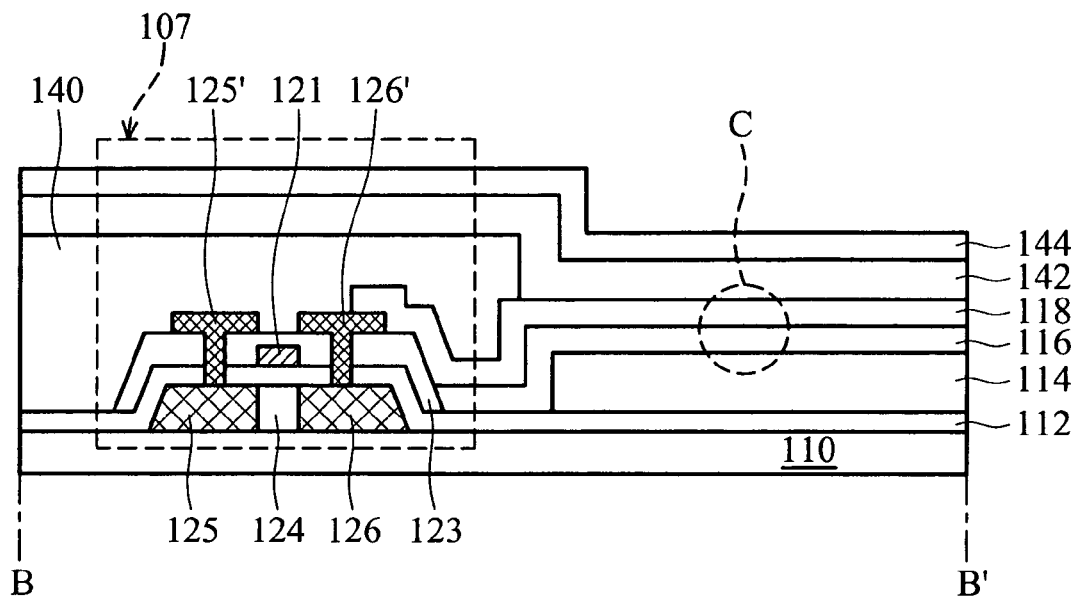

Finally, referring to FIG. 4e, an organic electroluminescent layer 142 and a metal electrode 144 are sequentially formed on the above structure, thus completing fabrication of the full-color active matrix organic electroluminescent device. The transparent electrode 118, and the organic electroluminescent layer 142 and metal electrode 144 thereupon comprise an OLED 105 (referring to FIG. 3). Preferably, the organic electroluminescent layer 142 is organic semiconductor material, such as small molecule material, polymer, or organometallic complex and can be formed by thermal vacuum evaporation, spin coating, dip coating, roll-coating, injection-filling, embossing, stamping, physical vapor deposition, or chemical vapor deposition. The metal electrode 144 serves as the cathode electrode of the OLED 105. To meet the requirements for a cathode of an OLED, material capable of injecting electrons into an organic electroluminescent layer is preferable, for example, a low work function material such as Ca, Ag, Mg, Al, Li, or alloys thereof.

The flat layer 116 serving as an under layer for the OLEDs is formed on the color filters without damaging the color filters, thereby solving the problems occurring.

Figure 5:
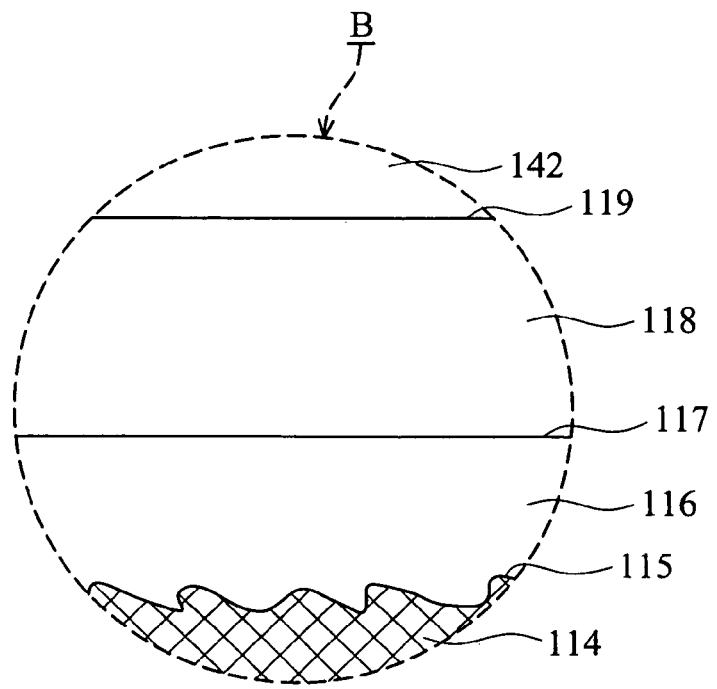
FIG. 5 is a close-up cross-section view of location C shown in FIG. 4e.

FIG. 5 is a close-up cross-section view of location C shown in FIG. 4e. According to embodiments of the present invention, due to the low roughness of the flat layer surface 117, the flat layer 116 cab prevent the transparent electrode surface 119 from being adversely affected by the rough color filter surface 115 and facilitates flatness of the transparent electrode surface 119, thereby ameliorating short circuit or current leakage. Moreover, in the manufacturing process of the active matrix organic electroluminescent device, before forming an organic electroluminescent layer, the transparent electrode 118 undergoes a surface treatment with $O_2$ plasma to improve the performance thereof. In this embodiment, the flat layer 116 formed between the color filter 114 and the transparent electrode 118 can further prevent damage to the color filter 114 caused by $O_2$ plasma.

Figure 6:
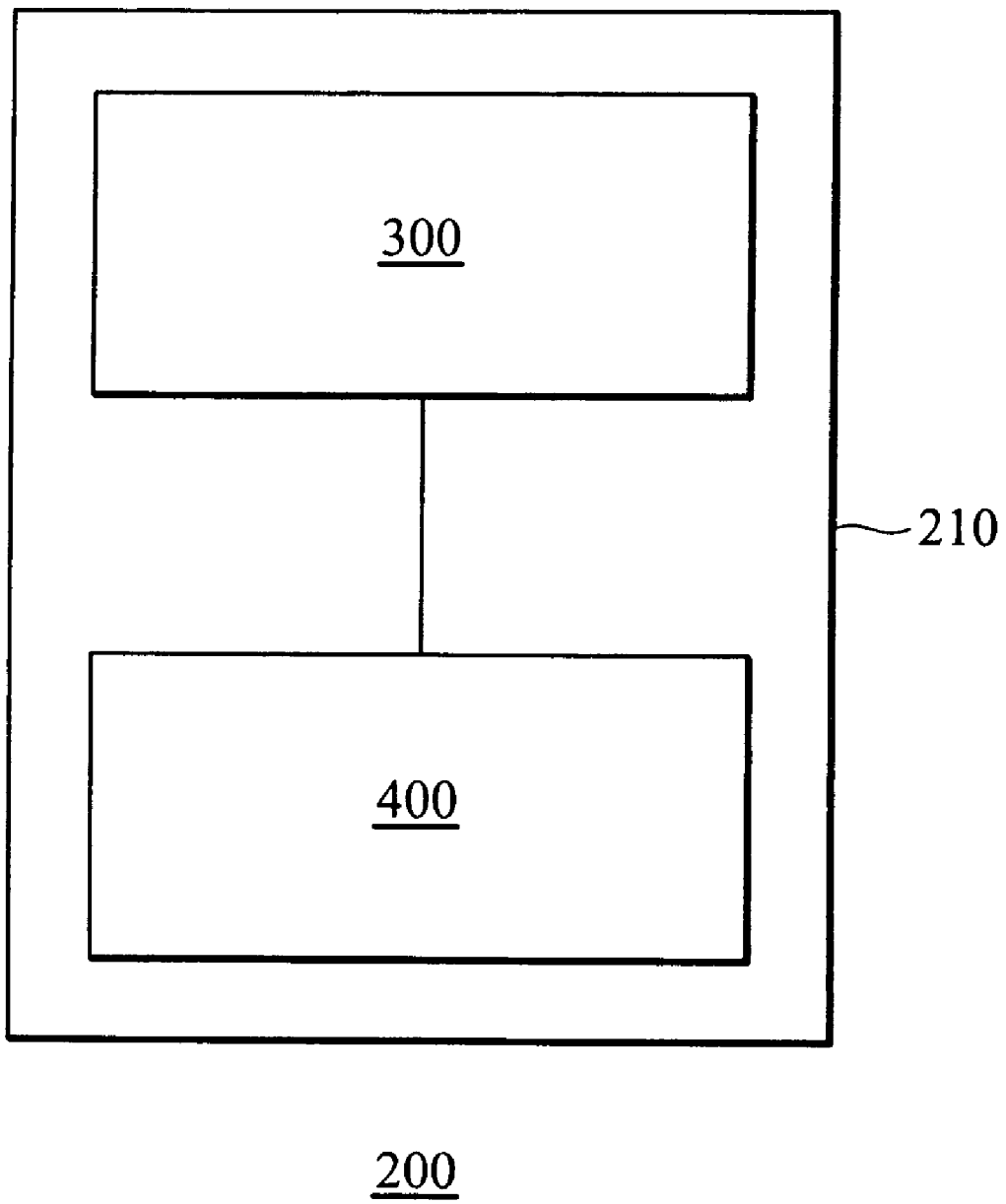
FIG. 6 is a schematic drawing of an electronic device incorporating the full-color active matrix organic electroluminescent device according to an embodiment of the invention.

FIG. 6 is a schematic drawing of an electronic device incorporating the full-color active matrix organic electroluminescent device according to embodiments of the present invention. The electronic device 200 includes a case 210, a controller 300 (which may collectively represent or include a power source, active and passive electronics, input/output terminals, data storage elements, etc.), and a full-color active matrix organic electroluminescent device 400 comprising a purality of pixel areas 100, wherein the controller 300 operatively coupled to the full-color active matrix organic electroluminescent device 400 for controlling operation thereof. The electronic device can be, for example, a mobile telephone, a personal computer, or a personal digital assistant (PDA).

Although the invention has been particularly shown and described with reference to the preferred specific embodiments and examples, it is anticipated that alterations and modifications thereof will no doubt become apparent to those skilled in the art. It is therefore intended that the following claims be interpreted as covering all such alteration and modifications as fall within the true spirit and scope of the present invention.

What is claimed is:

1. A color active matrix organic electroluminescent device, comprising a plurality of pixel areas arranged in a matrix, each pixel area comprising:
   a thin film transistor formed on a substrate;
   a buffer layer formed on the substrate beyond the thin film transistor;
   a color filter formed on the buffer layer;
   a flat layer formed on the color filter;
   a first electrode formed on the flat layer and electrically connected to the thin film transistor;
   an organic electroluminescent layer formed on the first electrode; and
   a second electrode formed on the organic electroluminescent layer.

2. The device as claimed in claim 1, wherein the flat layer is fanned by a low temperature thin film process.

3. The device as claimed in claim 2, wherein the low temperature thin film process has an operating temperature not more than 350° C.

4. The device as claimed in claim 1, wherein the surface roughness of the flat layer is less than 10 nm.

5. The device as claimed in claim 1, wherein the flat layer has a thickness more than 10 times larger than the surface roughness of the color filter.

6. The device as claimed in claim 2, wherein the low temperature thin film process is liquid phase deposition., spin-on coating, or sputtering.

7. The device as claimed in claim 2, wherein the law temperature thin film process is low temperature magnetron sputtering.

8. The device as claimed in claim 1, wherein the flat layer is low temperature dielectric layer or spin-on glass.

9. An electronic device, comprising
   a color active matrix organic electroluminescent device as claimed in claim 2; and
   a controller, wherein the controlleroperatively couples to the full-color active matrix organic electroluminescent device.

10. The device as claimed in claim 1, wherein the first electrode is formed directly on the flat layer.

11. The device as claimed in claim 1, wherein the first electrode is formed directly on and touching the flat layer.

12. The device as claimed in claim 1, wherein the first electrode is formed on the flat layer with out an intervening layer.

13. The device as claimed in claim 1, wherein the flat layer has a planarized surface on which the first electrode is formed.

14. The device as claimed in claim 1, wherein the flat layer has a smooth top surface on which the first electrode is formed.

* * * * *